(12) United States Patent
Yumoto

(10) Patent No.: US 7,672,180 B2
(45) Date of Patent: Mar. 2, 2010

(54) SEMICONDUCTOR MEMORY DEVICE CAPABLE OF CONFIRMING A FAILED ADDRESS AND A METHOD THEREFOR

(75) Inventor: Naotaka Yumoto, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 12/128,838

(22) Filed: May 29, 2008

(65) Prior Publication Data
US 2008/0298144 A1 Dec. 4, 2008

(30) Foreign Application Priority Data
May 31, 2007 (JP) ............................. 2007-145498

(51) Int. Cl.
*G11C 11/00* (2006.01)
(52) U.S. Cl. .................................. 365/200; 365/230.06
(58) Field of Classification Search .................. 365/200, 365/230.06
See application file for complete search history.

(56) References Cited

U.S. PATENT DOCUMENTS 6,950,334 B2 * 9/2005 Shimizu et al. ............. 365/158
7,286,422 B2 * 10/2007 Marumoto et al. .......... 365/201
7,397,713 B2 * 7/2008 Harari et al. ................ 365/200
7,535,780 B2 * 5/2009 Lee ............................ 365/200

FOREIGN PATENT DOCUMENTS

JP   8203296   8/1996

* cited by examiner

*Primary Examiner*—Michael T Tran
(74) *Attorney, Agent, or Firm*—Studebaker & Brackett PC; Donald R. Studebaker

(57) ABSTRACT

A semiconductor memory device includes an address buffer, a row decoder, a column decoder, a fuse circuit, a memory cell array including regular and redundant memory cells, a regulator, a regular sense amplifier, a redundant sense amplifier, a selection circuit, an input/output buffer, and a test control circuit for a test mode. The test control circuit controls the regular and redundant sense amplifiers so as to output the signal upon accessing a regular memory cell different in level from that output upon accessing a redundant memory cell, whereby a failed address can be electrically confirmed with ease.

3 Claims, 3 Drawing Sheets

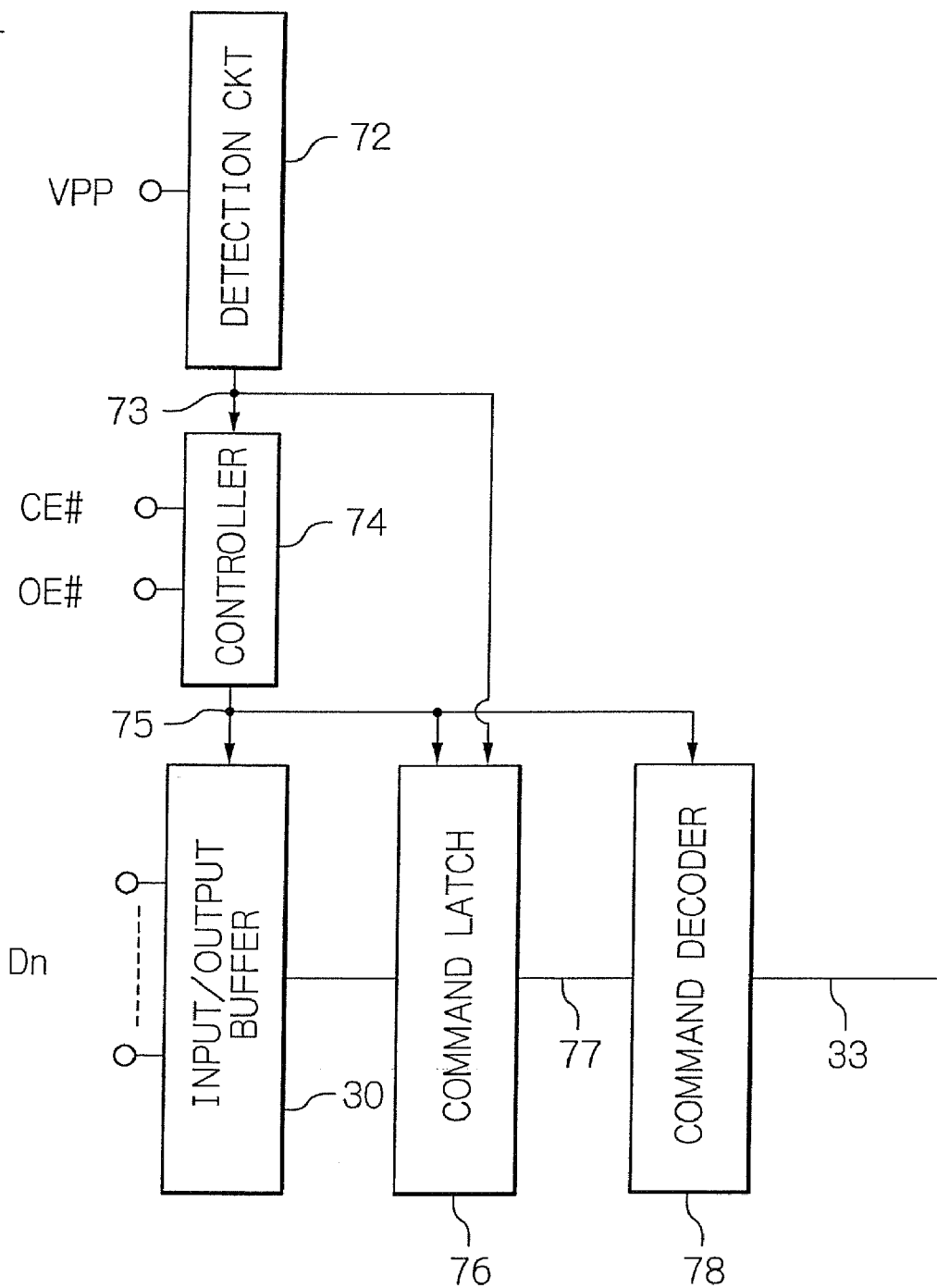

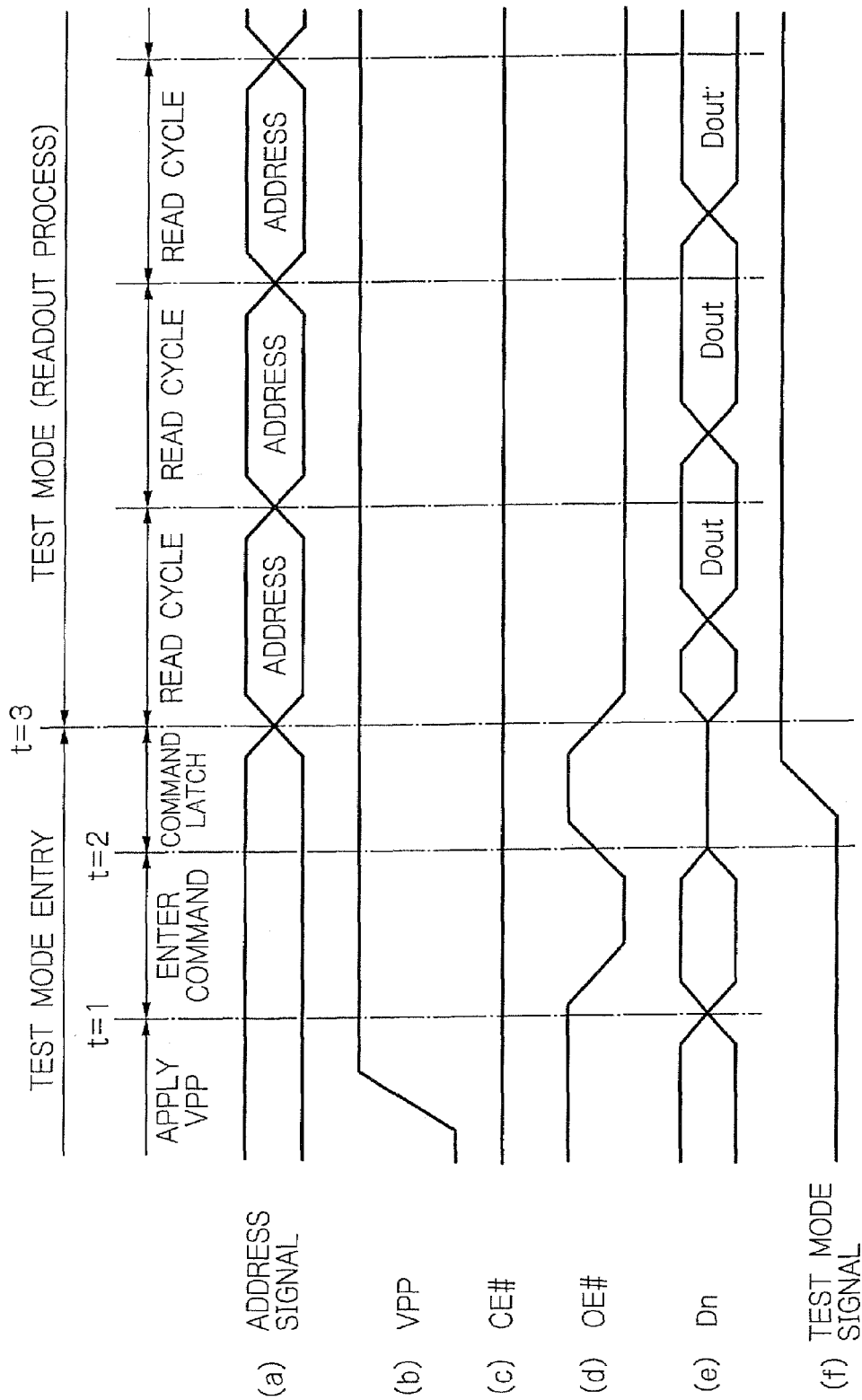

SEMICONDUCTOR MEMORY DEVICE CAPABLE OF CONFIRMING A FAILED ADDRESS AND A METHOD THEREFOR

BACKGROUND OF THE INVENTION

1. Field of the Invention

The present invention relates to a semiconductor memory device, and more particularly to a semiconductor memory device in which a failed row or column in a memory array including a failed memory cell is electrically replaceable by a redundant row or column, respectively. The invention also relates to a method of electrically confirming a failed memory cell in such a memory device.

2. Description of the Background Art

The semiconductor memory device has so far suffered a problem that the production yield tends to be lowered due to defects, such as a failed memory cell, or breakage or short-circuiting of a word or bit line. The conventional practice to cope with this problem has been to provide a redundant memory cell array including redundant memory cells in advance on the semiconductor chip, in addition to the regular memory cells 41, so as to electrically replace a failed row or column including the failed memory cell by the redundant row or column, respectively.

With such a semiconductor memory device, there is no solution for electrically confirming the address of a row or column including a failed memory, i.e. "failed address", to be replaceable by a redundant row or column. Such a solution has been demanded, heretofore.

A solution for electrically confirming a failed address in a semiconductor memory device is disclosed, for example, by Japanese patent laid-open publication No. 203296/1996, in which a semiconductor memory device including a voltage dropper circuit. In the solution, when a redundant row or column is selected to replace the regular row or column, respectively, the semiconductor memory device is run in operation not by the decreased power supply voltage but by an external power supply voltage. Thus, a measurement of the power supply current or the access time would make it possible to verify whether or not the redundant row or column has been selected.

However, the solution disclosed in the Japanese publication has a problem that it inherently involves an analog fuzziness in the verification.

SUMMARY OF THE INVENTION

It is an object of the present invention to provide a semiconductor memory device capable of confirming a failed address with ease, and a method therefor.

In accordance with the present invention, a semiconductor memory device includes a control circuit for controlling a test operation. More specifically, during the test operation, the control circuit controls a regular sense amplifier and a redundant sense amplifier in the semiconductor memory device, such that when a regular memory cell is accessed, the test control circuit controls the regular sense amplifier to cause the latter to output a high level signal, i.e. a signal of binary '1', or a low level signal, i.e. a signal of binary '0', and that when a redundant memory cell is accessed, the control circuit controls the redundant sense amplifier so as to cause the redundant sense amplifier to output the low level signal when the high level signal is output from the regular memory cell, and cause the redundant sense amplifier to output the high level signal when the low level signal is output from the regular memory cell.

In the invention, since the signal output on accessing the regular memory cell is rendered different in signal level from the signal output on accessing the redundant memory cell, it is possible to specify where a failed address is to be replaced by a signal output from the redundant memory cell with ease and to verify read-out data digitally. Moreover, the semiconductor memory device of the invention can execute test operation by at least one test control circuit even if there are multiple redundant memory cell rows or columns, and hence can prevent from increasing the space of a semiconductor chip on which the memory device is fabricated.

BRIEF DESCRIPTION OF THE DRAWINGS

The objects and features of the present invention will become more apparent from consideration of the following detailed description taken in conjunction with the accompanying drawings in which:

FIG. 2 is a schematic block diagram showing a specific constitution of the test control circuit shown in FIG. 1; and FIG. 3 is a timing chart showing the signals appearing when running the semiconductor memory device shown in FIG. 1 in a test mode.

DESCRIPTION OF THE PREFERRED EMBODIMENT

Figure 1:
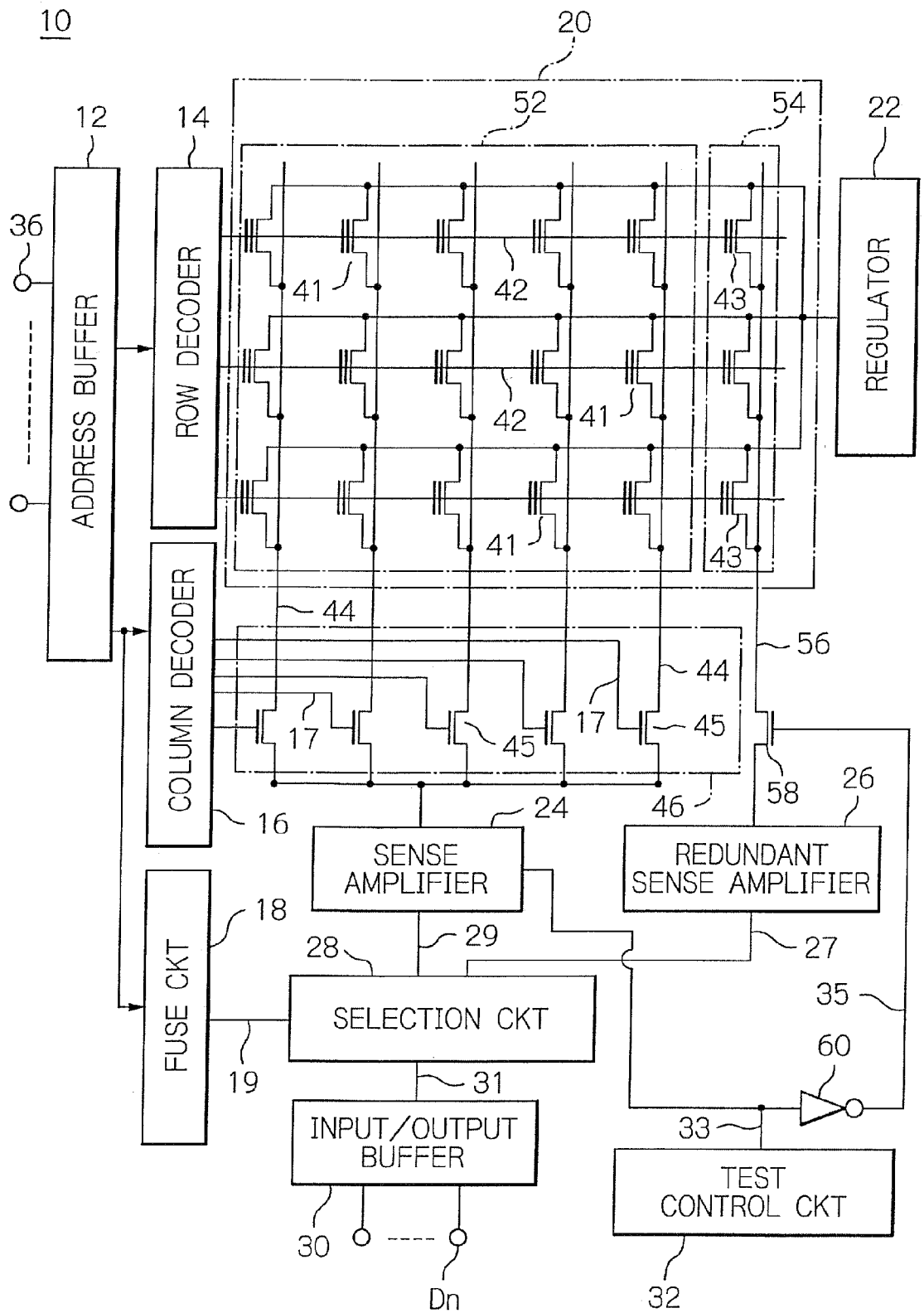
FIG. 1 is a schematic block diagram showing an embodiment of a semiconductor memory device according to the present invention.

With reference to the accompanying drawings, a preferred embodiment of the present invention will be described in detail. With reference to FIG. 1, a semiconductor memory device 10 of the present illustrative embodiment includes an address buffer 12, a row decoder 14, a column decoder 16, a fuse circuit 18, a memory cell array 20, a regulator 22, a sense amplifier 24, a redundant sense amplifier 26, and a selection circuit 28, which are interconnected as illustrated. The semiconductor memory device further includes an input/output buffer 30 and a test control circuit 32 interconnected as shown. The semiconductor memory device 10 is adapted to store or read out data in or from a memory cell or cells 41 specified by an address delivered to input terminals 36 connected to the address buffer 12. The figures do not include elements not directly relevant to the understanding of the present invention, and detailed description thereof will not be made in order to avoid redundancy.

The semiconductor memory device 10 shown in FIG. 1 is, of course, only illustrative and may be changed or modified, as desired within the scope of the idea of the invention. For example, the semiconductor memory device 10 thus illustrated is adapted to include the redundant circuitry only for a bit line, but may be adapted to include redundant circuitry provided for both of the bit and word lines.

In FIG. 1, to the address buffer 12, the input terminals 36 are connected. The input terminals 36 are to be supplied, from outside, with an address signal that specifies desired one of memory cells 41 in the form of parallel bits. The address buffer 12 is adapted to temporarily hold the input address signal and delivers the input address signal to the row decoder 14, column decoder 16 and fuse circuit 18. It should be noted that the same address signal is supplied also to the column decoder 16 and fuse circuit 18.

The row decoder 14 is adapted to select corresponding one of the word lines 42 in response to the address signal delivered from the address buffer 12. For example, in the illustrative embodiment, the row decoder 14 decodes part of the address signal supplied via the address buffer 12 into the address of a corresponding row of memory cells 41 so as to select a word line 42 corresponding to the thus decoded signal.

The column decoder 16 is adapted to select a corresponding bit line 44 via a column switch 46 in response to another part of the address signal delivered from the address buffer 12. For example, in the present embodiment, the column decoder 16 decodes the other part of the address signal supplied via the address buffer 12 into the address of corresponding one of the memory cells 41 in a row selected by the row decoder 14, and causes the column switch 46 to select corresponding one of bit lines 44 in response to the thus decoded signal 17. In the description, signals are designated with reference numerals of connections on which they are conveyed.

The fuse circuit 18 is adapted to determine whether or not the address supplied from the address buffer 12 is coincident with the address of a column, i.e. "failed address", with the illustrative embodiment, which column includes a failed memory cell 41 to be replaced by a redundant column 54, or a redundant memory cell array. More specifically, the fuse circuit 18 includes a plurality of fuse elements, not shown, in which there are stored a failed address, and the fuse circuit 18 compares an address supplied from the address buffer 12 with the failed address stored therein to determine whether or not the address supplied from the address buffer 12 is the failed address. In the illustrative embodiment, the fuse circuit 18 stores the address of a failed column as the failed address in the fuse elements.

When having determined that the delivered address is consistent with the failed address, the fuse circuit 18 delivers a redundancy enable signal 19 to the selection circuit 28 so as to cause the selection circuit 28 to select a signal 27 output from the redundant sense amplifier 26 to allow the amplifier 24 and switch 58 to access the redundant memory cells 43 in the redundant memory cell array 54 instead of the regular memory cells 41 in the regular memory dell array 52. Conversely, when an address delivered from the address buffer 12 is not coincident with the failed address stored in the fuse circuit 18, the fuse circuit 18 does not output the redundancy enable signal 19 to the selection circuit 28. Hence, the selection circuit 28 develops the signal 29 output from the regular memory cells 41 to input/output buffer 30 rather than the output signal 27 from the redundant memory cells 43 in the redundant memory cell array 54.

The memory cell array 20 includes a large number of memory cells 41 and 43 that take advantage of the difference in threshold voltages of MOS transistors forming the cells. The memory cells 41 and 43 belong to the regular and redundant memory cell arrays 52 and 54, respectively. More specifically, in the illustrative embodiment, since the semiconductor memory device 10 has the redundant circuitry constituted for the bit line 56, the memory cells 41 and 43 belong to regular and redundant memory lines 52 and 54, respectively, as shown in FIG. 1. In that sense, the memory cell arrays 52 and 54 may sometimes be referred to as "lines" of memory cells, e.g. regular and redundant memory lines 52 and 54. As stated earlier, however, since the semiconductor memory device 10 may be adapted to include redundant circuitry provided for both of the bit and word lines, the term "line" may be directed not only to a bit line as the illustrative embodiment but also to a word line in terms of the regular and redundant arrays of memory cells.

Now, in the regular memory lines, or lines of memory cells, 52, the regular memory cells 41 have drain and source electrodes connected to the regulator 22 in common and to the bit lines 44, respectively. In the redundant memory line, or line of memory cells, 54, the redundant memory cells 43 have drain and source electrodes connected to the regulator 22 also in common and to the redundant bit line 56, respectively. The regular memory array 52 and redundant memory array 54 co-own the word lines 42 to which the control gate electrodes of the regular memory cells 41 and the redundant memory cells 43 are connected.

In the regular memory lines 52, the bit lines 44 are connected to the sense amplifier 24 via a switching element 45 of the column switch 46 which is selectively enabled by a decoded signal 17 delivered from the column decoder 16. When one of the switching elements 45 is selected by the decoded signal 17, the selected switching element 45 connects the bit line 44 associated therewith to the sense amplifier 24, resulting in that the memory cell 41 disposed at the intersection of the selected bit line 44 and the word line 14 selected by the row decoder corresponds to the input address and the current flowing through the memory cell 41 thus selected is delivered to the sense amplifier 24.

The sense amplifier 24 is adapted to convert the current delivered through the memory cell 41 thus selected into a corresponding voltage so as to supply it to the selection circuit 28. More specifically, in the illustrative embodiment, the sense amplifier 24 amplifies the supplied current and converts it into logic, or binary, signals, which have predetermined alternative levels, e.g. a low level signal '0' or a high level signal '1', to supply the resulting signal 29 to the selection circuit 28.

In the redundant memory array, i.e. line 54, the redundant bit line 56 is connected to the redundant sense amplifier 26 via a redundant column switch 58 which has its source electrode connected to the redundant sense amplifier 26, such that, when the redundant column switch 58 is on or conductive, the current flowing through the redundant bit line 56 is routed to the redundant sense amplifier 26. Like the sense amplifier 24, the redundant sense amplifier 26 is adapted to convert the current supplied into a corresponding voltage, which is then supplied to the selection circuit 28. More specifically, in the illustrative embodiment, the redundant sense amplifier 26 amplifies current supplied through the redundant memory cell 43 and converts it into logic signals, that is, a low level signal '0' or a high level signal '1', to supply the resulting signal 27 to the selection circuit 28.

The selection circuit 28 is adapted to select the signal 29 or 27 output from the sense amplifier 24 or the redundant sense amplifier 26, respectively, to route the so selected signal 31 to the input/output buffer 30. In the illustrative embodiment, the selection circuit 28 is connected to the sense amplifier 24, redundant sense amplifier 26 and fuse circuit 18. If the fuse circuit 18 has determined that the memory cell 41 is to be read out from the regular memory line 52, that is, if the selection circuit 28 receives no significant redundancy enable signal 19 from the fuse circuit 18, then the selection circuit selects the signal 29 output from the sense amplifier 24, i.e. the signal read out from the regular memory lines 52, so as to route the signal 31 to the input/output buffer 30.

If conversely the fuse circuit 18 has determined that the memory cell 41 is to be read out from the redundant sense amplifier 26, that is, if the selection circuit 28 receives the significant redundancy enable signal 19 from the fuse circuit 18, then the selection circuit 28 selects the signal 27 output from the redundant sense amplifier 26, i.e. the signal read out from the redundant memory line 54, so as to route the signal 31 to the input/output buffer 30. The input/output buffer 30 has a set of input/output terminals Dn in order to output the selected signal via the input/output terminals Dn in the form of parallel bits.

The input/output terminals Dn may operate as input terminals depending on the operational mode, such as test or data writing mode, wherein data to be written in the semiconductor memory device 10 are delivered as input to the input/output terminals Dn. It should be noticed that, although the description of various parts of the semiconductor memory device 10 has so far been made taking an illustrative case of reading out the memory cells 41, writing the memory cells 41 may be achieved in a substantially reverse way of the above-described operation. Hence, the description for the latter case will not be made in order to avoid redundancy.

For the address buffer 12, row decoder 14, column decoder 16, fuse circuit 18, memory cell array 20, regulator 22, sense amplifier 24, redundant sense amplifier 26, selection circuit 28, input/output buffer 30, column switch 46 and redundant column switch 58 per se may be conventional and the semiconductor memory device 10 may be constructed with such conventional elements. Also, the present invention should not be limited to the constitution of the semiconductor memory device 10 specifically shown and described with reference to FIG. 1 but any suitable type of semiconductor memory device having a redundant circuit may be used. Further, the semiconductor memory device 10 may be volatile or non-volatile.

In the conventional semiconductor memory device having a redundant circuit, it has so far been difficult to electrically confirm a failed address stored from the outset in the fuse circuit 18. Thus, the semiconductor memory device 10 of the present embodiment includes a test control circuit 32 for controlling a test mode. More specifically, the test control circuit 32 controls the sense amplifier 24 and the redundant sense amplifier 26 when the semiconductor memory device 10 is run in a test mode. It is therefore possible to confirm electrically a failed address stored, in advance, in the fuse circuit 18 as described in detail below.

The test control circuit 32 for the test mode is adapted to control the sense amplifier 24 and the redundant sense amplifier 26 by a test mode signal in the test mode operation, i.e. in an operation for electrically confirming a failed address stored in advance in the fuse circuit 18. More specifically, the test control circuit 32 is connected to the sense amplifier 24 and also to the source electrode of the redundant column switch 58 via a logical inverter, or NOT gate, 60 to the redundant sense amplifier 26. In the test mode operation, the circuit 32 thus controls the sense amplifier 24 and redundant sense amplifier 26 so as to have the sense amplifier 24 and redundant sense amplifier 26 deliver signals 29 and 27, respectively, opposite in level to each other, independently of the current flowing through the accessed regular memory cell 41 and redundant memory cell 43.

In the illustrative embodiment, the test control circuit 32 routes the test mode signal 33 in its high level to the sense amplifier 24 so as to control the latter such that, when the regular memory cell 41 is accessed, the sense amplifier 24 outputs its signal 29 in its high level, independently of the current flowing through the accessed regular memory cell 41. The control circuit 32 also routes the low-level test mode signal 35 to the gate electrode of the redundant column switch 58 so as to control the redundant sense amplifier 26 such that, when the redundant memory cell 43 is accessed, the redundant sense amplifier 26 outputs its signal 27 in its low level, independently of the current flowing through the accessed redundant memory cell 43.

Of course, the test control circuit 32 shown in FIG. 1 is only illustrative and may be changed or modified, as desired. For example, any suitable method may be adopted to control the sense amplifier 24 and the redundant sense amplifier 26.

FIG. 2 is a schematic block diagram showing the test control circuit 32 for the test mode shown in FIG. 1. The test controller 32 includes a detection circuit 72 for high voltage, a controller 74, an input/output buffer 30, a command latch 76 and a command decoder 78, which are interconnected as illustrated. In FIG. 2, structural parts and elements like those shown in FIG. 1 are designated by the identical reference numerals, and will not be described repetitively in order to avoid redundancy.

In FIG. 2, the detection circuit 72 for high voltage has an input terminal VPP for high voltage to which a high voltage is applied, e.g. in the test mode operation and writing data operation. When the high voltage is applied to the input terminal VPP, the detection circuit 72 is responsive to it to output a selection signal 73 which is delivered to the controller 74 from the detection circuit 72.

The controller 74 is adapted to combine a control signal supplied on an input terminal CE# or OE# with the selection signal 73 delivered from the high voltage detection circuit 72 so as to output a control signal 75 matched to the operating mode of the semiconductor memory device 10.

More specifically, in the illustrative embodiment, the controller 74 includes one input terminal CE# for a chip enable signal and the other input terminal OE# for an output enable, to which the chip and output enable signals are supplied, respectively, and combines the chip of output enable signal with the signal 73 which is received from the detection circuit 72 so as to form the control signal 75 to route the so formed control signal 75 to the input/output buffer 30, command latch 76 and command decoder 78.

The input/output buffer 30 has the set of data output terminals Dn described earlier. When a signal is supplied to the data output terminals Dn, the signal is routed via the input/output buffer 30 to the command latch 76. The command latch 76 has its output 77 delivered to the command decoder 78 in which the signal 77 is decoded to be the test mode signal 33 which is supplied to the sense amplifier 24 and also to the source electrode of the redundant column switch 58 shown in FIG. 1, when the semiconductor memory device 10 is run under the test mode.

FIG. 3 is a timing chart schematically showing an example of the operation of the semiconductor memory device 10 under the test mode. In FIG. 3, in order to start running the semiconductor memory device 10 under the test mode, the operation for initiating the test mode, that is, test mode entry is carried out.

In the test mode entry, a high voltage is initially applied to the high voltage input terminal VPP. In the illustrative embodiment, the high voltage applied to the high voltage input terminal VPP is not higher than the write voltage applied in writing, but may, for example, be equal to the power supply voltage +3V. Of course, the value of the high voltage is only illustrative and any suitable high voltage may be applied to the high voltage input terminal VPP. When the high voltage is applied to the high voltage input terminal VPP, the high voltage detection circuit 72 is responsive to the high voltage to supply the selection signal 73 to the controller 74. In the controller 74, the chip enable signal CE# is maintained at its high level as shown in FIG. 3, line (c).

At time t=1 in FIG. 3, to the input/output terminals Dn, a predetermined code, or command, is delivered so that the output enable signal OE# is changed from its high level to its low level. At this time, the input/output terminals Dn is inhibited from outputting data and is enabled to accept an input. The input/output buffer 30 and the command latch 76 are also enabled to respond to an input.

Then, at time t=2, the output enable signal OE# is changed from its low level to its high level, as shown in FIG. 3, line (d) so that the code is latched by the command latch 76 and, as shown in FIG. 3, line (f), the high-level test mode signal 33 is output from the command decoder 78. This high-level test mode signal 33 is selected continuously. The so selected test mode signal 33 is supplied to the sense amplifier 24 and the redundant column switch 58 via the NOT circuit 60, FIG. 1, whereby the semiconductor memory device 10 is ready to be run under the test mode.

Specifically, the high level test mode signal 33 is routed to the sense amplifier 24, so that, by this high level test mode signal 33, the high-level signal, i.e. logical '1', is output all the time from the sense amplifier 24. On the other hand, the NOT circuit 60 inverts the high level test mode signal to output a complementary signal 35 to the high level test mode signal, that is, '0', so that it is routed to the gate electrode of the redundant column switch 58. Hence, the gate electrode of the redundant column switch 58 is not selected. The current flowing through the redundant bit line 56 is thus zero, so that the logical '0' is output all the time from the redundant sense amplifier 26. This high level test mode signal 33 is continuously selected as long as the high-voltage is applied to the high voltage input terminal VPP. It should be noted that, during this test mode operation, the components of the semiconductor memory device 10 other than those controlled by the test mode signal 33, such as the sense amplifier 24, redundant column switch 58 and redundant sense amplifier 26, perform the usual and known operation.

Thereafter, as shown in FIG. 3, line (d), the output enable signal OE# is set at time t=3 from its high level to its low level. In this state, a readout operation is carried out on the semiconductor memory device 10 operating in the test mode. That is, the read cycle is repeated. More specifically, with the present embodiment, any optional word line 42 is selected and, in this state, all column addresses are delivered to the column decoder 16 to carry out readout once.

At this time, the components of the semiconductor memory device 10 other than the sense amplifier 24, redundant column switch 58 and redundant sense amplifier 26 perform the usual operation, as described above. Hence, the addresses delivered to the column decoder 16 are also delivered to the fuse circuit 18. Thus, if the address delivered to the fuse circuit 18 is coincident with a failed address, i.e. if the redundant memory line 54 is accessed, then the low level signal, '0', is output from the selection circuit 28 to the input/output buffer 30. This results because the redundant column switch 58 is turned off by the test mode signal and hence the signal '0' is necessarily output from the redundant sense amplifier 26.

On the other hand, if the input address is not coincident with a failed address, i.e. if the regular memory line 52 is accessed, then the high level signal, '1', is output from the selection circuit 28 to the input/output buffer 30. The reason is that the sense amplifier 24 is controlled by the test mode signal to output logical '1' all the time.

Thus in the illustrative embodiment, any of the word lines 42 is selected and all addresses are input to the column decoder 16 to thereby execute the normal readout operation to detect where a logical '0' is output, allowing it to be determined which of the columns involves a defect memory cell, i.e. which column involves a failed address. For example, in the illustrative embodiment, the output data, during the test mode operation, of the semiconductor memory device 10 are delivered to a known test device, not shown, in which the output data are checked against data having its all bits equal to '1' provided at the outset, thereby determining which of its bit positions are equal to binary '0' to locate a failed address on the column basis.

Of course, the test mode operation shown in FIG. 3 is only illustrative and may be changed or modified, as desired. For example, the illustrative embodiment is adapted to select any of the word lines 42. It is however possible to carry out readout processing on all of the addresses without specifying a word line 42 to determine in which column there is a failed memory cell or cells.

After specifying a failed address, as described above, the high voltage ceases to be applied to the high voltage input terminal VPP of the test control circuit 32 to discontinue the operation under the test mode.

Thus, in the semiconductor memory device 10 of the instant embodiment, the sense amplifier 24 is controlled by the test control circuit 32 to output logical '1' or '0' if, during the test mode operation, the regular memory cell 41 is accessed. On the other hand, when the redundant memory cell 43 is accessed, under the test mode, the redundant sense amplifier 26 is controlled via the redundant column switch 58 to output logical '0' when logical '1' is output from the sense amplifier 24 and to output logical '1' when logical '0' is output from the sense amplifier 24 respectively. By so doing, it is possible to specify with ease which address is a failed address.

Moreover, with the present embodiment, in which a failed address is confirmed by controlling the sense amplifier and the redundant sense amplifier, at least one circuit for the test mode suffices, with the result that a failed address may be confirmed without increasing a space on the semiconductor chip. The illustrative embodiment shown in FIG. 1 is directed to confirming a failed address by the semiconductor memory device 10 in which the redundant circuit is constructed on the bit line basis. However, this is merely illustrative and the way of confirming a failed address according to the present invention may be applied to any type of semiconductor memory device having a redundant circuit. For example, the present invention may be applied to a semiconductor memory device having both a redundant circuit constructed on a bit line basis and a redundant circuit constructed on a bit line basis.

The entire disclosure of Japanese patent application No. 2007-145498 filed on May 31, 2007, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A semiconductor memory device comprising:
    a first line of memory cells including a plurality of memory cells;
    a second line of memory cells electrically replaceable for said first line of memory cells;
    an address comparator for comparing an input address with a first address specifying said first line of memory cells as a failed address;
    a first converter for receiving a first signal from said first line of memory cells for converting the first signal into a first corresponding logic signal;
    a second converter for receiving a second signal from said second line of memory cells for converting the second signal into a second corresponding logic signal;

a selector for selecting the second logic signal output when said address comparator has determined that the input address coincides with the failed address; and a controller for controlling test operation to cause said first converter to output a high level signal or a low level signal, said controller causing said second converter to output the low level signal when said first converter outputs the high level signal, and causing said second converter to output the high level signal when said first converter outputs the low level signal.

2. The semiconductor memory device in accordance with claim 1, further comprising a switch circuit for causing the first signal from said second line of memory cells to be supplied to said second converter, said controller being connected to said first converter to cause said first converter to output the high level signal, said controller being connected to said switch circuit to cause said second converter to output the low level signal.

3. A method for electrically confirming a failed address in a semiconductor memory device which includes a first line of memory cells having a plurality of memory cells, a second line of memory cells electrically replaceable for the first line of memory cells, an address comparator for comparing an input address with a first address specifying the first line of memory cells as a failed address, a first converter for receiving a first signal from the first line of memory cells for converting the first signal into a first corresponding logic signal, a second converter for receiving a second signal from the second line of memory cells for converting the second signal into a second corresponding logic signal, and a selector for selecting the second logic signal when the address comparator has determined that the input address coincides with the failed address, said method comprising the steps of:

causing the first converter to output a high level signal or a low level signal;

causing the second converter to output the low level signal when the first converter outputs the high level signal, and causing the second converter to output the high level signal when the first converter outputs the low level signal; and reading out the first signal from the first line of memory cells and the second signal from the second line of memory cells.

* * * * *

UNITED STATES PATENT AND TRADEMARK OFFICE
CERTIFICATE OF CORRECTION

PATENT NO. : 7,672,180 B2 Page 1 of 1
APPLICATION NO. : 12/128838
DATED : March 2, 2010
INVENTOR(S) : Naotaka Yumoto It is certified that error appears in the above-identified patent and that said Letters Patent is hereby corrected as shown below:

On the Title Page
Item (75) Inventor should read:   Naotaka Yumoto, Kanagawa (JP)

Signed and Sealed this

Twenty-fourth Day of August, 2010

David J. Kappos
*Director of the United States Patent and Trademark Office*